(12) United States Patent
Ye et al.

(10) Patent No.: US 10,373,586 B2
(45) Date of Patent: Aug. 6, 2019

(54) DISPLAY DEVICE

(71) Applicant: SAMSUNG DISPLAY CO., LTD., Yongin-si, Gyeonggi-do (KR)

(72) Inventors: Donghee Ye, Daegu (KR); Jeongman Son, Suwon-si (KR); Je-yun Lee, Asan-si (KR); Dong-sung Im, Asan-si (KR); Duyeon Han, Seongnam-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 35 days.

(21) Appl. No.: 15/496,382

(22) Filed: Apr. 25, 2017

(65) Prior Publication Data

US 2018/0061367 A1 Mar. 1, 2018

(30) Foreign Application Priority Data

Aug. 23, 2016 (KR) .................. 10-2016-0107207

(51) Int. Cl.
*G09G 5/10* (2006.01)
*G09G 3/34* (2006.01)
*G09G 3/36* (2006.01)
*G02F 1/1345* (2006.01)
*H01L 27/12* (2006.01)

(52) U.S. Cl.
CPC ........... *G09G 5/10* (2013.01); *G02F 1/13452* (2013.01); *G02F 1/13458* (2013.01); *G09G 3/3406* (2013.01); *G09G 3/3677* (2013.01); *G09G 3/3688* (2013.01); *G09G 2300/0413* (2013.01); *G09G 2320/0233* (2013.01); *H01L 27/124* (2013.01)

(58) Field of Classification Search
CPC ...... G09G 5/10; G09G 3/3688; G09G 3/3677; G09G 3/3406; G09G 2300/0413; G09G 2320/0233; H01L 27/124
See application file for complete search history.

(56) References Cited

U.S. PATENT DOCUMENTS 9,542,882 B2 * 1/2017 Kang .................. G09G 3/3225
2001/0026345 A1 10/2001 Park et al.
(Continued)

FOREIGN PATENT DOCUMENTS

KR 10-1021747 B1 3/2011
KR 10-1325325 B1 10/2013
(Continued)

*Primary Examiner* — Ibrahim A Khan
(74) *Attorney, Agent, or Firm* — Lee & Morse, P.C.

(57) ABSTRACT

A display device includes a display panel, a first flexible film, and a second flexible film. The display panel includes a non-display area outside a display area. The first flexible film is attached to a first side surface of the display panel. The second flexible film is attached to a second side surface of the display panel. The display panel includes a signal line, a pad electrode, and a side surface connection electrode. The signal line is in the display area and connects the first and second flexible films. The pad electrode extends from the signal line. The side surface connection electrode is on the first and second side surfaces and directly contacts the pad electrode. The first flexible film and the second flexible film are coupled to the side surface connection electrode and are electrically connected to the signal line.

20 Claims, 11 Drawing Sheets

(56) References Cited

U.S. PATENT DOCUMENTS

| | | | |
|---|---|---|---|
| 2003/0063080 A1* | 4/2003 | Takahashi | G02F 1/1345 345/211 |
| 2005/0286004 A1* | 12/2005 | Lee | G02F 1/1345 349/148 |
| 2006/0007086 A1* | 1/2006 | Rhee | G02F 1/13452 345/87 |
| 2007/0182909 A1* | 8/2007 | Kim | G02F 1/1345 349/149 |
| 2008/0192038 A1* | 8/2008 | Liu | G09G 3/20 345/206 |
| 2010/0033646 A1* | 2/2010 | Baek | G02F 1/1345 349/42 |
| 2012/0139881 A1* | 6/2012 | Kwon | G09G 3/3677 345/204 |
| 2014/0078123 A1 | 3/2014 | Park et al. | |
| 2014/0139413 A1* | 5/2014 | Kwon | G09G 3/3208 345/82 |
| 2014/0139771 A1* | 5/2014 | Choi | G09G 3/20 349/43 |
| 2014/0167052 A1* | 6/2014 | Park | G02F 1/136286 257/59 |
| 2014/0319527 A1* | 10/2014 | Shin | H01L 27/124 257/59 |
| 2014/0375922 A1* | 12/2014 | Park | G02F 1/136286 349/46 |
| 2015/0161928 A1 | 6/2015 | Kim et al. | |
| 2016/0379906 A1* | 12/2016 | Kim | G09G 3/3688 257/48 |
| 2017/0040345 A1* | 2/2017 | Jeong | H01L 27/124 |
| 2017/0092177 A1* | 3/2017 | Kobayashi | G09G 3/2018 |
| 2018/0011504 A1* | 1/2018 | Tanaka | G02F 1/1368 |
| 2018/0286316 A1* | 10/2018 | Yuki | G02F 1/1333 |

FOREIGN PATENT DOCUMENTS

| | | |
|---|---|---|
| KR | 10-2015-0047711 A | 5/2015 |
| KR | 10-2015-0066313 A | 6/2015 |
| KR | 10-2016-0002511 A | 1/2016 |
| KR | 10-2017-0115182 A | 10/2017 |

* cited by examiner

DISPLAY DEVICE

CROSS-REFERENCE TO RELATED APPLICATION

Korean Patent Application No. 10-2016-0107207, filed on Aug. 23, 2016, and entitled: "Display Device," is incorporated by reference herein in its entirety.

BACKGROUND

1. Field

One or more embodiments described herein relate to a display device.

2. Description of the Related Art

Module assembling equipment may be used to electrically connect a display panel and a driving chip during a post-process operation. The display panel and driving chip may be connected, for example, using a chip-on-glass (COG) mounting scheme or a tape-automated-bonding (TAB) mounting scheme.

In a COG mounting scheme, the driving chip is directly mounted on a gate area and a data area of the display panel. The driving chip is bonded to the display panel using an anisotropic conductive film (ACF).

In a TAB mounting scheme, a tape carrier package on which the driving chip is mounted is bonded to the display panel. One end of the tape carrier package is bonded to the display panel using the anisotropic conductive film. The other end of the tape carrier package is bonded to a printed circuit board.

SUMMARY

In accordance with one or more embodiments, a display device includes a display panel including a non-display area outside a display area; at least one first flexible film attached to a first side surface of the display panel; and at least one second flexible film attached to a second side surface of the display panel, wherein the display panel includes: a signal line, in the display area, connecting the at least one first flexible film and the at least one second flexible film; a pad electrode extending from the signal line; and a side surface connection electrode on the first and second side surfaces and directly contacting the pad electrode, the at least one first flexible film and the at least one second flexible film coupled to the side surface connection electrode and electrically connected to the signal line.

The display panel may include a data line and a gate line in the display area, the signal line includes a first signal line extending in a first direction along the data line in the display area and a second signal line extending in a second direction along the gate line in the display area, and the first signal line is electrically connected to the second signal line.

The pad electrode may include a first pad electrode extending from the first signal line and a second pad electrode extending from the second signal line, and the side surface connection electrode includes: a first side surface connection electrode on the first side surface and directly contacting the first pad electrode; and a second side surface connection electrode on the second side surface and directly contacting the second pad electrode.

The first signal line may be divided into two or more sub-signal lines, and the two or more sub-signal lines may be in the display area. The sub-signal lines may have different widths in the second direction. The display area may include a pixel line area including the signal line, an active area excluding the signal line, and the widths of the sub-signal lines decrease with increasing distance from the active area The display panel may include a dummy signal line in the non-display area and branched from the first signal line.

The display device may include a plurality of first flexible films; and a plurality of second flexible films, wherein the first signal line is divided into a plurality of sub-signal lines in the first direction, a first sub-signal line of the sub-signal lines connects the first flexible film and the second flexible film, and a second sub-signal line of the sub-signal lines electrically connects the second flexible films to each other. The sub-signal lines may be in the display area.

At least one of the second flexible films includes a connection line to electrically connect the first sub-signal line and the second sub-signal line. The first flexible film may be a data side flexible film electrically connected to the data line, the second flexible film may be a gate side flexible film electrically connected to the gate line, the first signal line may receive a signal from the first flexible film, and the signal may be applied to the second flexible film through the second signal line.

The display device may include a data driving chip, mounted on the first flexible film, to output a data signal applied to the data line; and a gate driving chip, mounted on the second flexible film, to output a gate signal applied to the gate line based on the signal. The signal may include a driving voltage and an off voltage to drive the gate driving chip. The display area may include a pixel line area including the signal line; an active area excluding the signal line; and an aperture ratio of a pixel in the pixel line area is different from an aperture ratio of a pixel in the active area.

The display device may include a signal controller to compensate for a difference in brightness between the pixel line area and the active area, wherein the signal controller includes: a signal extractor to receive input image data corresponding to the display area and to extract first image data corresponding to the pixel line area from the image data and second image data corresponding to the active area from the image data; a brightness compensator to receive the first image data and compensate for a brightness of the first image data to output compensation image data; and a data synthesizer to synthesize the compensation image data and the second image data in order to output entire image data corresponding to an entire of the display area.

The display device may include a backlight assembly at a rear side of the display panel to provide light to the display panel. The backlight assembly may include a light guide plate including a bottom surface, an exit surface facing the bottom surface, and side surfaces connecting the bottom and exit surfaces; and a light source, adjacent to one side surface of the side surfaces, to provide the light to the light guide plate.

The light guide plate may include a brightness control pattern on at least one of the bottom surface or the exit surface, and the brightness control pattern may compensate for the brightness difference between the pixel line area and active area.

The brightness control pattern may be on the bottom surface, and a density of the brightness control pattern in an area corresponding to the pixel line area may be greater than a density of the brightness control pattern in an area corresponding to the active area. A first light may be provided to the pixel line area by the backlight assembly may have an intensity greater than an intensity of a second light to be provided to the active area by the backlight assembly.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
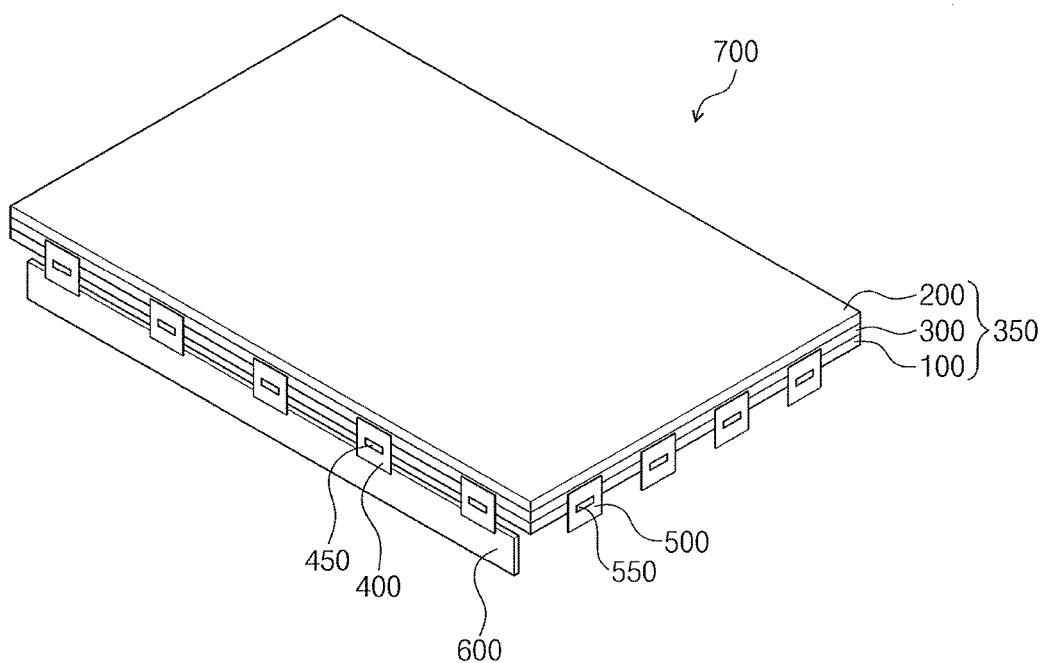
FIG. 1 illustrates an embodiment of a display device.

Example embodiments will be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
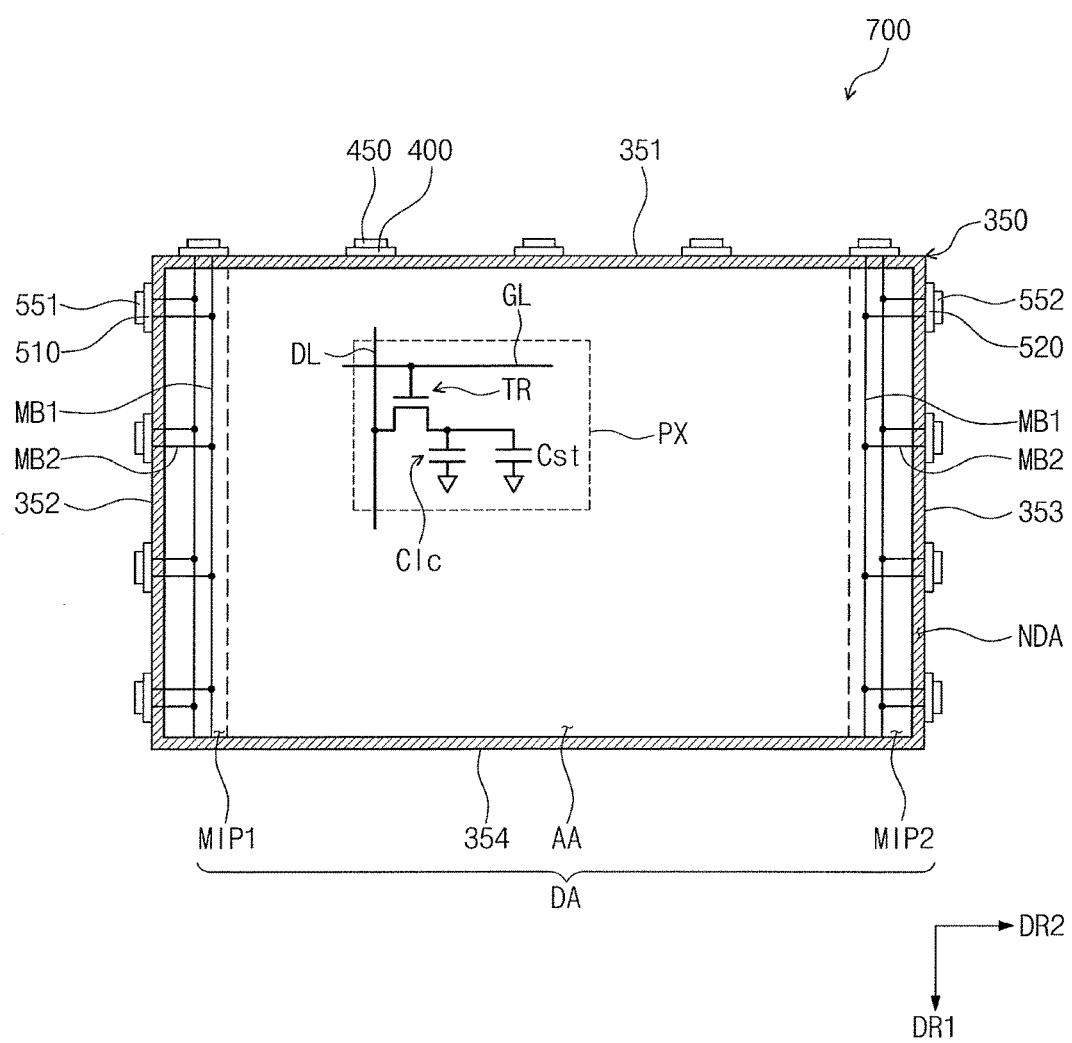
FIG. 2 illustrates a plan view of the display device.

FIG. 1 illustrates an embodiment of a display device 700, and FIG. 2 is a plan view showing the display device 700 shown in FIG. 1.

Referring to FIG. 1, the display device 700 includes a display panel 350 for displaying an image, a plurality of data side flexible film 400 attached to a side surface of the display panel 350, and a plurality of gate side flexible film 500 attached to a side surface of the display panel 350.

The display panel 350 may be, but is not limited to, an organic light emitting display panel, a liquid crystal display panel, a plasma display panel, an electrophoretic display panel, a microelectromechanical system (MEMS) display panel, or an electrowetting display panel. In the present exemplary embodiment, the liquid crystal display panel will be described as the display panel 350, but the display panel 350 should not be limited to the liquid crystal display panel. The display panel 350 includes a first substrate 100, a second substrate 200 facing and coupled to the first substrate 100, and a liquid crystal layer 300 between the first substrate 100 and the second substrate 200.

Referring to FIGS. 1 and 2, the display panel 350 includes a display area DA for displaying an image and a non-display area NDA outside the display area DA when viewed in a plan view. The non-display area NDA is at an edge portion of the display panel 350 and surrounds the display area DA.

The display panel 350 has, for example, a quadrangular shape when viewed in a plan view. In addition, the first and second substrates 100 and 200 are coupled to each other, such that edges of the first substrate 100 are aligned with edges of the second substrate 200 at four sides of the display panel 350. The non-display area NDA does not display an image. A light blocking material (e.g., a black matrix) is in the non-display area NDA to block light traveling to the outside of the display panel 350 through the non-display area NDA.

The display area DA includes a plurality of pixels PX arranged in a matrix form. For the convenience of explanation, FIG. 2 shows only one pixel.

The pixel PX includes a thin film transistor TR, a liquid crystal capacitor Clc, and a storage capacitor Cst. The thin film transistor TR, a first electrode of the liquid crystal capacitor Cst, and the storage capacitor Cst are disposed on the first substrate 100. The first substrate 100 further includes a gate line GL connected to the pixel PX and a data line DL connected to the pixel PX. The data line DL extends in a first direction DR1, and the gate line GL extends in a second direction DR2. The first direction DR1 is substantially perpendicular to the second direction DR2.

The gate line GL is connected to a gate electrode of the thin film transistor TR. The data line DL is connected to a source electrode of the thin film transistor TR. A drain electrode of the thin film transistor TR is connected to the first electrode (e.g., a pixel electrode) of the liquid crystal capacitor Clc.

The first substrate 100 further includes a first signal line MB1 in the display area DA and a second signal line MB2 insulated from the first signal line MB1 and crossing the first signal line MB1. The first signal line MB1 is substantially parallel to the data line DL. The second signal line MB2 is electrically connected to the first signal line MB1 and substantially parallel to the gate line GL.

In the present exemplary embodiment, areas, the first and second signal lines MB1 and MB2 in the display area DA may respectively be referred to as first and second pixel line areas MIP1 and MIP2. The first and second pixel line areas MIP1 and MIP2 may be at least a portion of the display area DA. As an example, the first pixel line area MIP1 corresponds to an area covering two pixel columns at a left portion of the display area DA. The second pixel line area MIP2 corresponds to an area covering two pixel columns at a right portion of the display area DA. In one embodiment, the first and second pixel line areas MIP1 and MIP2 may cover more pixel columns. An area between the first and second pixel line areas MIP1 and MIP2 may be referred to as an active area AA. The first and second signal lines MB1 and MB2 are not disposed in the active area AA.

The second substrate 200 is coupled to and faces the first substrate 100. The second substrate 200 includes a common electrode as a second electrode of the liquid crystal capacitor Clc. The common electrode faces the pixel electrode on the first substrate 100. In one embodiment, the common electrode may be on the first substrate 100 together with the pixel electrode according to an operational mode of the display device 700. The liquid crystal layer 300 is between the first substrate 100 and the second substrate 200. The liquid crystal layer 300 may serve as a dielectric material of the liquid crystal capacitor Clc between the pixel electrode and the common electrode.

The display device 700 further includes a data driving circuit 450 which is connected to the data line DL and which applies a data signal to the data line DL. The data driving circuit 450 includes a plurality of data driving chips respectively mounted on the data side flexible films 400. Among four side surfaces (e.g., first, second, third, and fourth side surfaces 351, 352, 353, and 354) of the display panel 350, the side surface to which the data side flexible films 400 are attached may be referred to as the first side surface 351.

The display device 700 further includes a gate driving circuit 550 which is connected to the gate line GL and which applies a gate signal to the gate line GL. The gate driving circuit 550 includes a plurality of gate driving chips respectively mounted on the gate side flexible films 500. Some of the gate side flexible films 500 are attached to the second side surface 352 among the first, second, third, and fourth side surfaces 351, 352, 353, and 354. Others or remaining ones of the gate side flexible films 500 are attached to the third side surface 353 among the first, second, third, and fourth side surfaces 351, 352, 353, and 354.

The flexible film attached to the second side surface 352 among the gate side flexible films 500 may be referred to as a first gate side flexible film 510. The flexible film attached to the third side surface 353 among the gate side flexible films 500 may be referred to as a second gate side flexible film 520. Among the gate driving chips, the driving chip mounted on the first gate side flexible film 510 may be referred to as a first gate driving chip 551. The driving chip mounted on the second gate side flexible film 520 may be referred to as a second gate driving chip 552.

The data side flexible film 400 has one end attached to the first side surface 351 of the display panel 350 and another end attached to the printed circuit board 600. The printed circuit board 600 applies image data signals and data control signals to the data driving chip 450, and applies first and second gate control signals to the first and second gate driving chips 551 and 552, respectively.

The data side flexible film 400 transmits the image data signal and the data control signal to the data driving chip 450 from the printed circuit board 600. The data driving chip 450 generates the data signal based on the image data signal and the data control signal. The generated data signal is applied to the display panel 350 through the data side flexible film 400.

The first and second gate control signals are respectively applied to the first and second gate driving chips 551 and 552 through the first and second signal lines MB1 and MB2, after being applied to the display panel 350 through the data side flexible film 400. For example, the first signal line MB1 includes a first left signal line in the first pixel line area MIP1 and electrically connected to the first gate driving chip 551 and a first right signal line in the second pixel line area MIP2 and electrically connected to the second gate driving chip 552.

As a result, the first and second signal lines MB1 and MB2 may be in the display area DA. The gate control signals output from the printed circuit board 600 are applied to the gate driving chip 550 through the data side flexible film 400 and the display panel 350. As described above, when the first and second signal lines MB1 and MB2 are in a portion of the display area DA and not in the non-display area NDA, the width of the non-display area NDA may be reduced. Accordingly, the bezel width of the display panel 350 may be reduced.

In FIGS. 1 and 2, the gate driving chips 550 are divided into two groups disposed on the second and third side surfaces 352 and 353 of the display panel 350. In one embodiment, the gate driving chips 550 may be on only one of the second or third side surfaces 352 and 353.

The data side flexible film 400 and the first and second gate side flexible films 510 and 520 are electrically connected to the display panel 350 to apply the signals to the display panel 250. In the present exemplary embodiment, the display device 700 has a side connection structure where the data side flexible film 400 and the first and second gate side flexible films 510 and 520 are connected to the side surface of the display panel 350.

Figure 3:
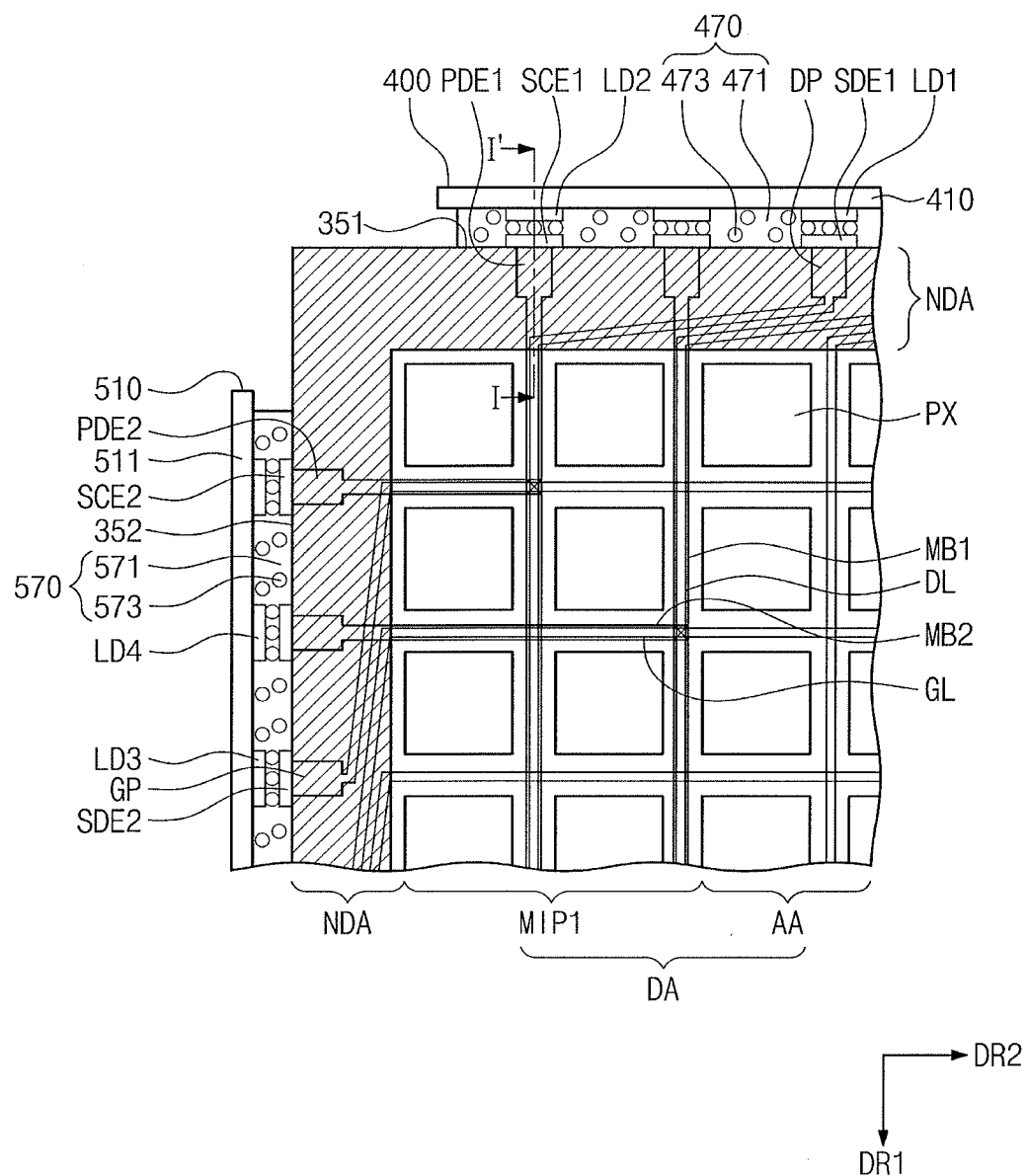
FIG. 3 illustrates an embodiment of a first substrate of the display device.
Figure 4:
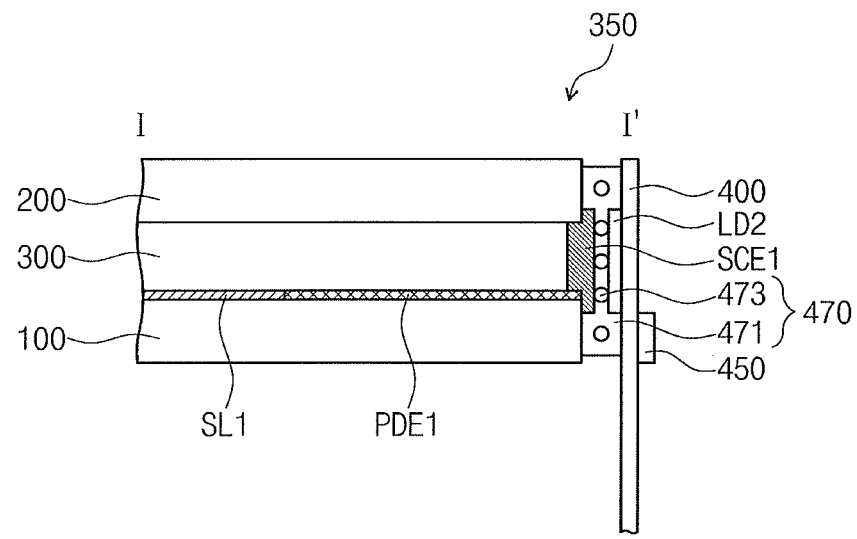
FIG. 4 illustrates a cross-sectional view taken along a line I-I' in FIG. 3.
Figure 5:
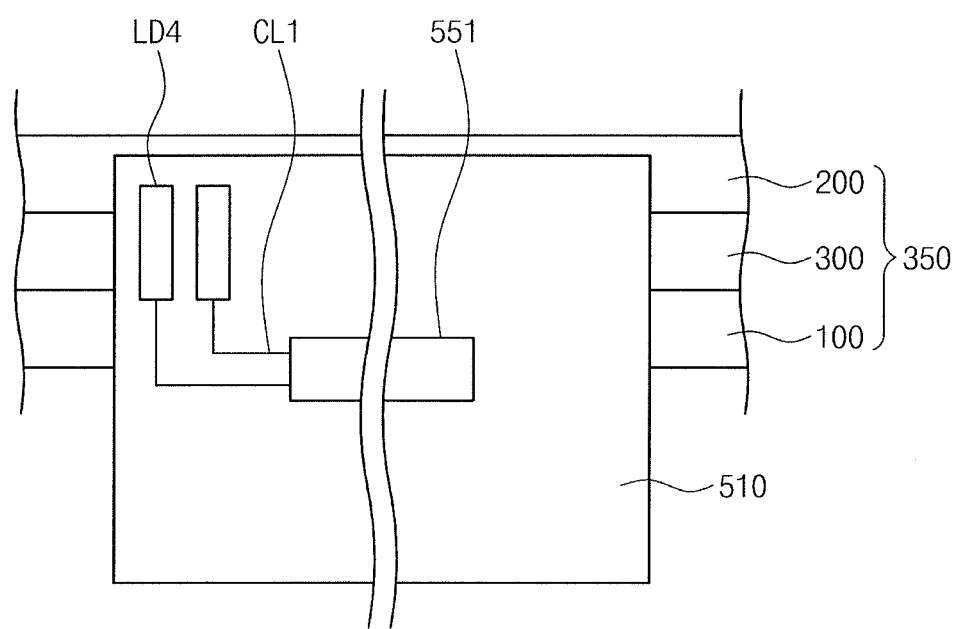
FIG. 5 illustrates an embodiment of a second side surface and a first gate side flexible film of a display panel.

FIG. 3 illustrates an embodiment of the first substrate 100 in FIG. 1. FIG. 4 illustrates a cross-sectional view taken along a line I-I' in FIG. 3. FIG. 5 illustrates a side view showing the second side surface 352 and the first gate side flexible film of the display panel 350 shown in FIGS. 1 to 3 according to one embodiment.

Referring to FIGS. 3 to 5, the first substrate 100 includes a display area DA and a non-display area NDA. The display area DA and the non-display area NDA of the first substrate 100 respectively correspond to the display area DA and the non-display area NDA of the display panel 350.

The first substrate 100 includes a data pad DP extending from the data line DL and a gate pad GP extending from the gate line GL. The data pad DP and the gate pad GP are in the non-display area NDA. As an example, the gate pad GP extends from one end or the other end of the gate line GL and are adjacent to the second side surface 352 or the third side surface 353. The gate pad GP adjacent to the second side surface 352 and the gate pad GP adjacent to the third side surface 353 may extend from different gate lines. For example, when the gate pad GP adjacent to the second side surface 352 extends from one end of an odd-numbered gate line, the gate pad GP adjacent to the third side surface 353 may extend from the other end of an even-numbered gate line.

The display panel 350 includes a side surface electrode on the side surface of the display panel 350. The side surface electrode includes a first side surface electrode SDE1 at the first side surface 351, a second side surface electrode SDE2 at the second side surface 352, and a third side surface electrode SDE3 at the third side surface 353. In one embodiment, one of the second side surface electrode SDE2 or the third side surface electrode SDE3 may be omitted from the display panel 350 in a structure where the gate side flexible films 510 and 520 are on only one of the second or third side surfaces 352 and 353.

The first, second, and third side surface electrodes SDE1, SDE2, and SDE3 may include, for example, a metal material containing silver (Ag) or carbon (C). The first side surface electrode SDE1 directly contacts the end of the data pad DP on the first side surface 351 of the display panel 350. The second side surface electrode SDE2 directly contacts the end of the gate pad GP on the second side surface 352 of the display panel 350. The third side surface electrode directly contacts the end of the gate pad GP on the third side surface 353 of the display panel 350.

In the present exemplary embodiment, the display panel 350 further includes a first pad electrode PDE1 extending from the first signal line MB1. The first pad electrode PDE1 is in the non-display area NDA, and a second pad electrode PDE2 extending from the second signal line MB2 is also in the non-display area NDA. In addition, the display panel 350 includes first and second side surface connection electrodes SCE1 and SCE2. The first side surface connection electrode SCE1 is on the first side surface 351 and directly contacts the first pad electrode PDE1 on the first side surface 351. The second side surface connection electrode SCE2 is on the second side surface 352 and directly contacts the second pad electrode PDE2 on the second side surface 352. The first and second side surface connection electrodes SCE1 and SCE2 may include, for example, a metal material, e.g., silver (Ag) or carbon (C).

The signal applied to the display panel 350 based on contact between the first side surface connection electrode SCE1 and the first pad electrode PDE1, and is applied to the second pad electrode PDE2 through the first signal line MB1 and the second signal line MB2. Then, the signal is applied to the first and second gate driving chips 551 and 552 through contact between the second pad electrode PDE2 and the second side surface connection electrode SCE2. In the present exemplary embodiment, the signal includes a driving voltage to drive the first and second gate driving chips 551 and 552 and an off voltage. In one embodiment, the signal may include a signal (e.g., a clock signal, a scan direction signal, etc.) in the gate control signal GCS (e.g., refer to FIG. 1).

The first and second side surface connection electrodes SCE1 and SCE2 may be substantially simultaneously formed with the first and second side surface electrodes SDE1 and SDE2 when the first and second side surface electrodes SDE1 and SDE2 are respectively formed on the first and second side surfaces 351 and 352 of the display panel 350. The first and second side surface electrodes SDE1 and SDE2 and the first and second side surface connection electrodes SCE1 and SCE2 on the first and second side surfaces 351 and 352 of the display panel 350 may be formed by various methods (e.g., a method for forming electrodes using a laser beam after depositing a metal material, a silk screen method, etc.).

As shown in FIG. 3, the data side flexible film 400 includes a first base film 410 and first and second line electrodes LD1 and LD2 on the first base film 410. The first base film 410 may be formed of a flexible material, e.g., polyimide. The first line electrode LD1 is connected to the data driving chip 450 to receive data signals from the data driving chip 450 (e.g., refer to FIG. 1). The second line electrode LD2 receives a signal from the printed circuit board 600 (e.g., refer to FIG. 1) to drive the first and second gate driving chips (e.g., refer to FIGS. 2) 551 and 552. In the present exemplary embodiment, the first and second line electrodes LD1 and LD2 may include a metal material, e.g., copper (Cu), Silver (Ag), gold (Au), or aluminum (Al).

The data side flexible film 400 may be attached to the first side surface 351 of the display panel 350 by a first anisotropic conductive film 470. The first anisotropic conductive film 470 includes a first adhesive film 471 having an adhesive property and first conductive particles 473 distributed in the first adhesive film 471. The first conductive particles 473 electrically connect the first line electrode LD1 and the first side surface electrode SDE1. Accordingly, a data signal from the data driving chip 450 is applied to a data line DL through the first line electrode LD1, the first side surface electrode SDE1, and the data pad DP.

The first conductive particles 473 electrically connect the second line electrode LD2 and the first side surface connection electrode SCE1. Thus, the driving voltage from the printed circuit board 600 or the gate control signal is applied to the first signal line MB1 through the second line electrode LD2, the first side surface connection electrode SCE1, and the first pad electrode PDE1.

The first gate side flexible film 510 include a second base film 511 and third and fourth line electrodes LD3 and LD4 on the second base film 511. The second base film 511 may be formed of flexible material, e.g., polyimide. The third line electrode LD3 is connected to the first gate driving chip 551 to receive the signal from the first gate driving chip 551. The fourth line electrode LD4 receives the gate control signal from the data side flexible film 400. In the present exemplary embodiment, the third and fourth line electrodes LD3 and LD4 may include a metal material, e.g., copper (Cu), Silver (Ag), gold (Au), or aluminum (Al).

The first gate side flexible film 510 may be attached to the second side surface 352 of the display panel 350 by a second anisotropic conductive film 570. The second anisotropic conductive film 570 includes a second adhesive film 571 having an adhesive property and second conductive particles 573 distributed in the second adhesive film 471. The second conductive particles 573 electrically connect the gate pad GP and the second side surface electrode SDE2. Accordingly, the gate signal from the first gate driving chip 551 is applied to the gate line GL through the third line electrode LD3, the second side surface electrode SDE2, and the gate pad GP.

In addition, the second conductive particles 573 electrically connect the fourth line electrode LD4 and the second side surface connection electrode SCE2. Thus, the fourth line electrode LD4 may receive the gate control signal through the first signal line MB1, the second signal line MB2, the second pad electrode PDE2, and the second side surface connection electrode SCE2.

Referring to FIG. 5, the fourth line electrode LD4 receives the driving voltage and the gate control signal from the printed circuit board 600 (e.g., refer to FIG. 1) through the above-mentioned path and applies the driving voltage and the gate control signal to the first gate driving chip 551.

The first gate side flexible film 510 may further include a first connection line CL1 to electrically connect the fourth line electrode LD4 and the first gate driving chip 551. The driving voltage and the gate control signal are provided through the fourth line electrode LD4 and are applied to the first gate driving chip 551 through the first connection line CL1.

FIGS. 1 to 5 illustrate an embodiment of a structure in which two first signal lines MB1 for applying two different signals in the gate control signals are in the display area DA. The number of the first signal lines MB1 may be different in another embodiment, e.g., three or more first signal lines MB1 may be in the display area DA to apply three or more different signals.

One or more signals corresponding to the gate control signal may be provided through the first signal line MB1 in the display area DA. In this case, a dummy signal line to receive the other signals (of the signals in the gate control signal) may be additionally disposed in the non-display area NDA of the display panel 350.

Since the lines used to apply the gate control signal to the first and second gate driving chips 551 and 552 are in the display area DA, rather than in the non-display area NDA, the width of the non-display area NDA may be reduced. As a result, the bezel width of the display panel 350 may be entirely reduced.

Figure 6:
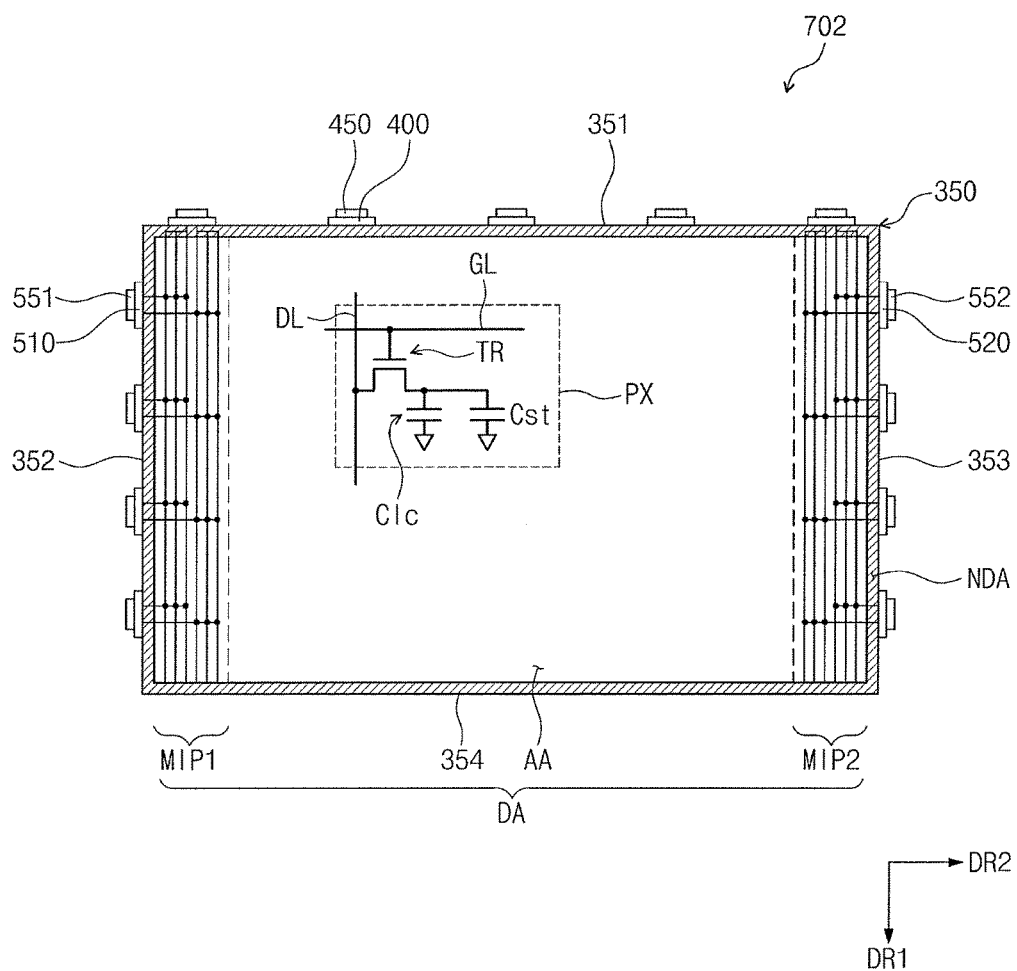
FIG. 6 illustrates another embodiment of a display device.
Figure 7:
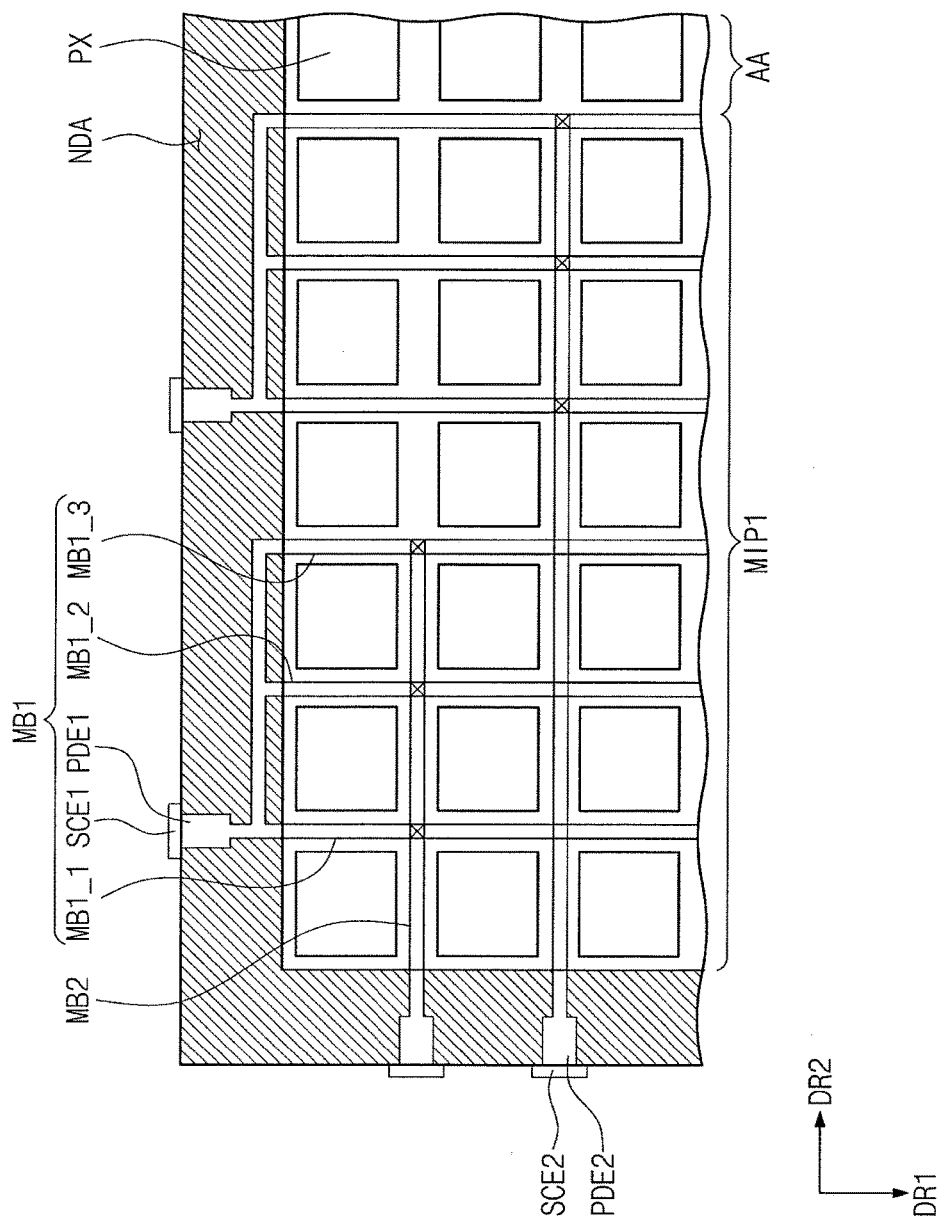
FIG. 7 illustrates an enlarged plan view of the display device in FIG. 6.

FIG. 6 illustrates an embodiment of a display device 702, and FIG. 7 illustrates an enlarged plan view of a portion of the display device 702 in FIG. 6. Unlike the display device in FIG. 3, the first signal line MB1 in the display device 702 in FIG. 6 includes three sub-signal lines MB1_1, MB1_2, and MB1_3.

Referring to FIGS. 6 and 7, the first substrate 100 includes the first signal line MB1 disposed in the display area DA and the second signal line MB2 insulated from the first signal line MB1 while crossing the first signal line MB1.

The first signal line MB1 includes first, second, and third sub-signal lines MB1_1, MB1_2, and MB1_3 extending in the first direction DR1 and substantially parallel to the data line DL. In the present exemplary embodiment, the first signal MB1 includes three sub-signal lines MB1_1, MB1_2, and MB1_3. In one embodiment, the number of the sub-signal lines is determined depending on a line width and a line resistance of the sub-signal lines MB1_1, MB1_2, and MB1_3.

The second signal line MB2 electrically contacts the first, second, and third sub-signal lines MB1_1, MB1_2, and MB1_3. The second signal line MB2 extends in the second direction DR2 substantially perpendicular to the first direction DR1 and is on a different layer from the first, second, and third sub-signal lines MB1_1, MB1_2, and MB1_3.

In one embodiment, the second signal line MB2 directly contacts at least one of the first, second, or third sub-signal lines MB1_1, MB1_2, and MB1_3 that are electrically connected to the first signal line MB1. In one embodiment, the second signal line MB2 directly contacts all of the first, second, and third sub-signal lines MB1_1, MB1_2, and MB1_3.

In the present exemplary embodiment, the first, second, and third sub-signal lines MB1_1, MB1_2, and MB1_3 are in the display area DA and overlap the data lines DL (e.g., refer to FIGS. 2 and 3). Areas in which the first, second, and third sub-signal lines MB1_1, MB1_2, and MB1_3 are disposed may be referred to as first and second pixel line areas MIP1 and MIP2.

The first and second pixel line areas MIP1 and MIP2 may be at least a portion of the display area DA. As an example, the first pixel line area MIP1 corresponds to an area covering six pixel columns at a left portion of the display area DA. The second pixel line area MIP2 corresponds to an area covering six pixel columns at a right portion of the display area DA. In one embodiment, the first and second pixel line areas MIP1 and MIP2 may cover more pixel columns.

In addition, an area between the first and second pixel line areas MIP1 and MIP2 may be referred to as an active area AA. The first and second signal lines MB1 and MB2 are not in the active area AA.

The first, second, and third sub-signal lines MB1_1, MB1_2, and MB1_3 may have the same width in the second direction DR2.

The first, second, and third sub-signal lines MB1_1, MB1_2, and MB1_3 may have the same width as the data lines DL. When the first, second, and third sub-signal lines MB1_1, MB1_2, and MB1_3 have the same width as the data lines DL, the brightness of the first and second pixel line areas MIP1 and MIP2 may not become lower than that of the active area AA, even though the first, second, and third sub-signal lines MB1_1, MB1_2, and MB1_3 are in the display area DA. In one embodiment, at least one of the first, second, or third sub-signal lines MB1_1, MB1_2, and MB1_3 may have a width greater than the data lines DL.

Figure 8:
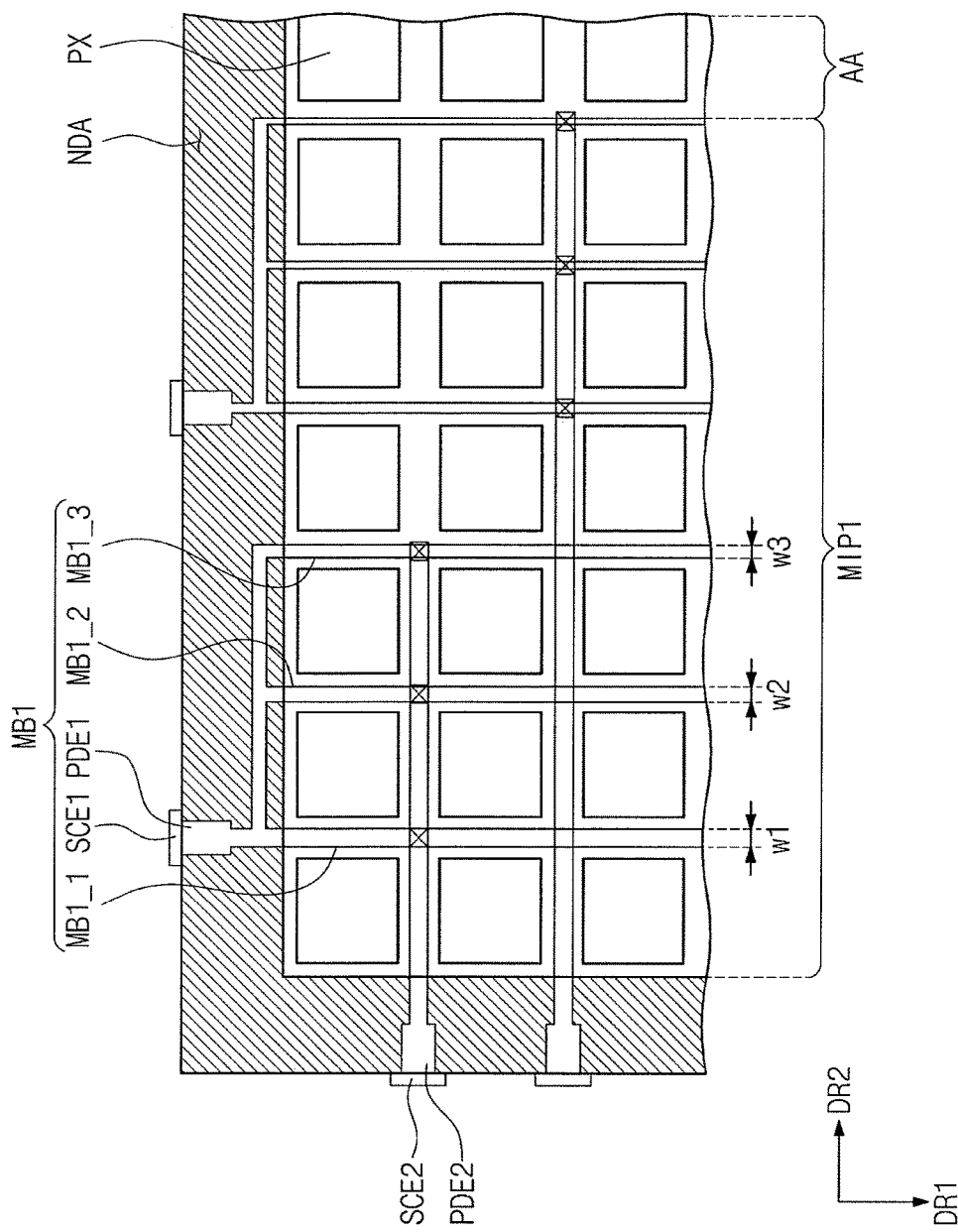
FIG. 8 illustrates another embodiment of a display panel.

FIG. 8 illustrates an embodiment of a display panel, which may have the same structure and function as the display panel in FIG. 7, except that the first, second, and third sub-signal lines MB1_1, MB1_2, and MB1_3 have different widths.

Referring to FIG. 8, the first, second, and third sub-signal lines MB1_1, MB1_2, and MB1_3 are sequentially arranged in the second direction DR2 from the non-display area NDA, extend in the first direction DR1, and are substantially parallel to each other.

The first, second, and third sub-signal lines MB1_1, MB1_2, and MB1_3 have different widths. For instance, the first sub-signal line MB1_1 most adjacent to the non-display area NDA (among the first, second, and third sub-signal lines MB1_1, MB1_2, and MB1_3) has a first width w1 greater than that of the second and third sub-signal line MB1_2 and MB1_3. The second sub-signal line MB1_2 following the first sub-signal line MB1_1 has a second width w2 less than the first width w1. The third sub-signal line MB1_3 has a third width w3 less than the second width w2.

The width of the first, second, and third sub-signal lines MB1_1, MB1_2, and MB1_3 may be reduced, for example, as the distance from the non-display area NDA increases on an imaginary line substantially parallel to the second direction DR2.

When the first, second, and third sub-signal lines MB1_1, MB1_2, and MB1_3 have a width greater than the data line, the brightness of the first pixel line area MIP1 (in which the first, second, and third sub-signal lines MB1_1, MB1_2, and MB1_3 are disposed) may be lower than that of the active area AA. To compensate for the difference in brightness between the first pixel line area MIP1 and the active area AA, a structure may be provided where the widths of the first, second, and third sub-signal lines MB1_1, MB1_2, and MB1_3 decrease with increasing distance from the non-display area NDA and decreasing distance from the active area AA. For example, brightness may gradually decrease in the first pixel line area MIP1 as the distance from the non-display area NDA increases and as the distance from the active area AA decreases. Thus, a difference in brightness may be prevented from being perceived by the eyes of a viewer.

FIGS. 7 and 8 show the first pixel line area MIP1 among the first and second pixel line areas MIP1 and MIP2 in FIG. 6. The first, second, and third sub-signal lines MB1_1, MB1_2, and MB1_3 may have the structure as in FIGS. 7 and 8 in the second pixel line area MIP2.

Figure 9:
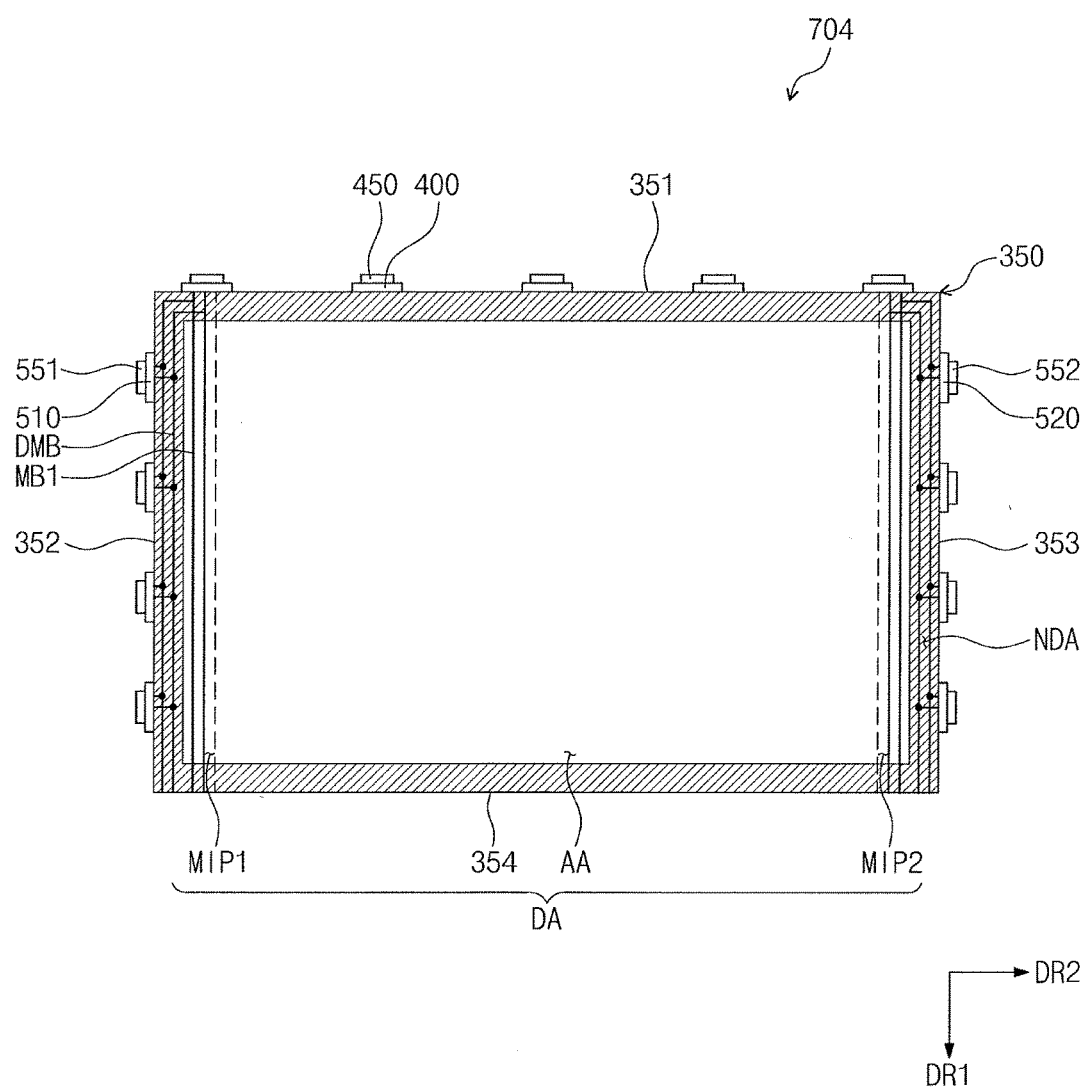
FIG. 9 illustrates another embodiment of a display device.

FIG. 9 illustrates another embodiment of a display device 704, which may have the same structure and function as the display device in FIG. 3, except that the display device 704 further includes a dummy signal line DMB in the non-display area NDA in addition to the first signal line MB1 in the display area DA.

Referring to FIG. 9, the first substrate 100 includes the first signal line MB1 in the display area DA and the second signal line MB2 insulated from the first signal line MB1 and crossing the first signal line MB1. The first substrate 100 further includes the dummy signal line DMB in the non-display area NDA and electrically connected to the data side flexible film 400.

The dummy signal line DMB branches from the first signal line MB1 and is parallel to the first signal line MB1 in non-display area NDA. In the present exemplary embodiment, a line branched from the first signal line MB1 and in the non-display area NDA may be referred to as the dummy signal line DMB. In one embodiment, signal lines independent from the first signal line MB1 may be in the non-display area NDA, in addition to the dummy signal line DMB connected to first signal line MB1. In one embodiment, the dummy signal line DMB and the first signal line MB1 may have different line widths.

The second signal line MB2 electrically contacts the dummy signal line DMB. The second signal line MB2 extends in the second direction DR2 substantially perpendicular to the first direction DR1 and is on a different layer from the dummy signal line DMB. The second signal line MB2 directly contacts the dummy signal line DMB in the non-display area NDA, but the second signal line MB2 is electrically connected to the first signal line MB1. In one embodiment, the second signal line MB2 may directly contact the first signal line MB1 in the display area DA. In this case, the second signal line MB2 may be electrically connected to the dummy signal line DMB without making direct contact with the dummy signal line DMB.

According to FIG. 9, when the dummy signal line DMB is in the non-display area NDA, the width of the non-display area NDA may increase when compared to that of the display panels in FIGS. 3 to 6. However, as shown in FIG. 9, the display device 704 has a hybrid structure in which the signal line connecting the data side flexible film 400 and first and second gate flexible films 510 and 520 is divided into two disposed in the display area DA and the non-display area NDA.

Figure 10:
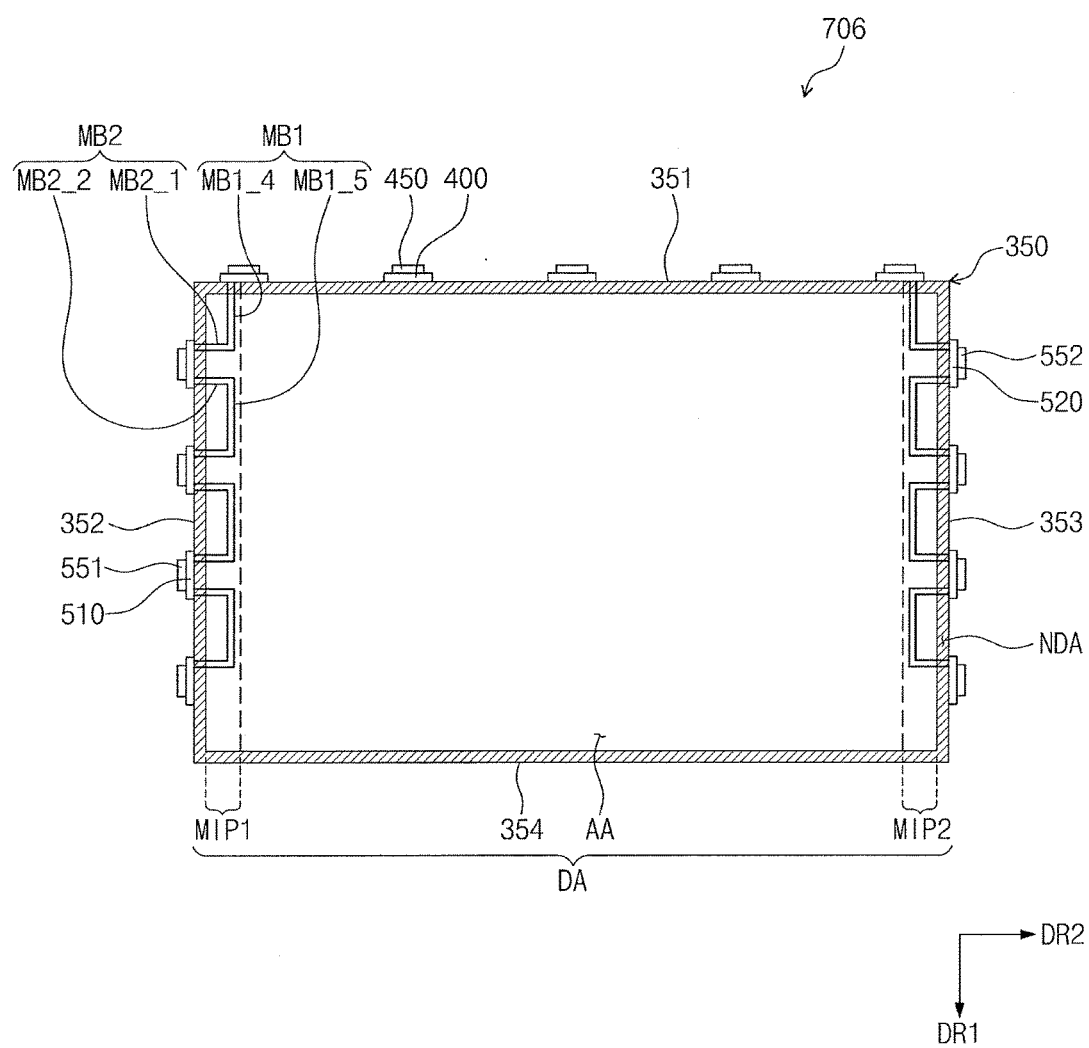
FIG. 10 illustrates another embodiment of a display device.
Figure 11:
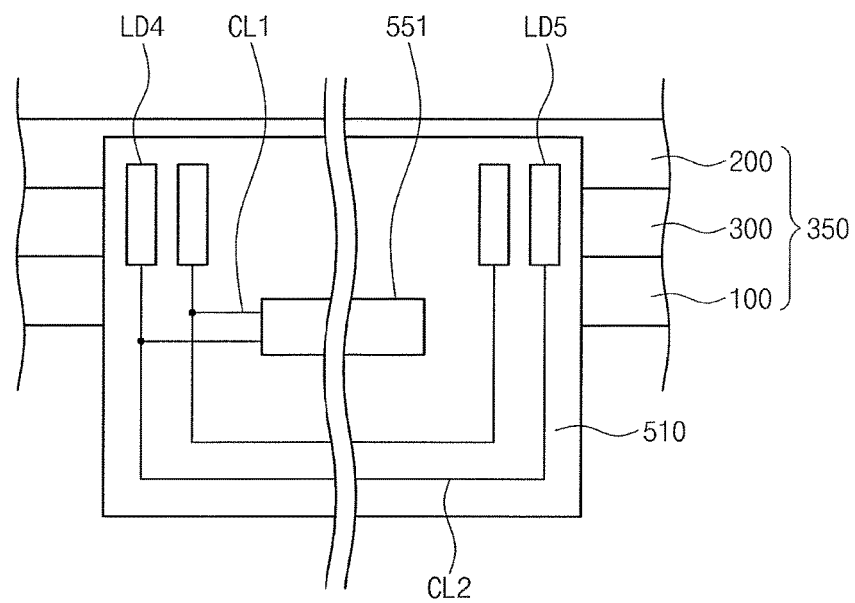
FIG. 11 illustrates an embodiment of a first gate flexible film in FIG. 10.

FIG. 10 illustrates another embodiment of a display device 706, and FIG. 11 is an embodiment of a side view of a first gate side flexible film in FIG. 10. The display device 706 may have the same structure and function as the display devices in FIGS. 1 to 9, except that the first signal line MB1 in the display area DA is divided into a predetermined number of parts.

The first signal line MB1 may include a fourth sub-signal line MB1_4 connecting the data side flexible film 400 and the first gate side flexible film 510 and a fifth sub-signal line MB1_5 connecting the first gate side flexible films 510 to each other. The fourth and fifth sub-signal lines MB1_4 and MB1_5 extend in the first direction DR1. The fourth sub-signal line MB1_4 electrically connects the data side flexible film 400 and the second gate side flexible film 520. The fifth sub-signal line MB1_5 electrically connects the second gate side flexible films 520 to each other.

The second signal line MB2 includes a sixth sub-signal line MB2_1 electrically connecting the fourth sub-signal line MB1_4 to the first gate side flexible film 510 and a seventh sub-signal line MB2_2 electrically connecting the fifth sub-signal line MB1_5 to the first gate side flexible film 510 adjacent to the fifth sub-signal line MB1_5. The sixth sub-signal line MB2_1 electrically connects the fourth sub-signal line MB1_4 to the second gate side flexible film 520, and the seventh sub-signal line MB2_2 electrically connects the fifth sub-signal line MB1_5 to the second gate side flexible films 520.

Referring to FIG. 11, the first gate side flexible film 510 includes a first connection line CL1 to electrically connect the fourth line electrode LD4 and the first gate driving chip 551 as described with reference to FIG. 5. The fourth line electrode LD4 is at a left side of the first gate driving chip 551.

The first gate side flexible film 510 further includes a fifth line electrode LD5 at the right side of the first gate driving chip 551. The first gate side flexible film 510 includes a second connection line CL2 to electrically connect the fourth line electrode LD4 and the fifth line electrode LD5.

In the present exemplary embodiment, the fourth and fifth line electrodes LD4 and LD5 are electrically connected to the second signal line MB2. For example, the fourth line electrode LD4 is electrically connected to one of the sixth sub-signal line MB2_1 and the seventh sub-signal line MB2_2. The fifth line electrode LD5 is electrically connected to the seventh sub-signal line MB2_2.

In the present embodiments, the first signal line MB1, which connects the data side flexible film 400 and the first and second gate side flexible films 510 and 520, is in the display area DA. Also, the first and second pixel line areas MIP1 and MIP2 in which the first signal line MB1 is disposed may have a brightness lower than that of the active area AA by the first signal line MB1.

An embodiment of a method for reducing a difference in brightness between the active area AA and the first and second pixel line areas MIP1 and MIP2 will now be described. The method may be performed, for example, by a signal controller.

Figure 12:
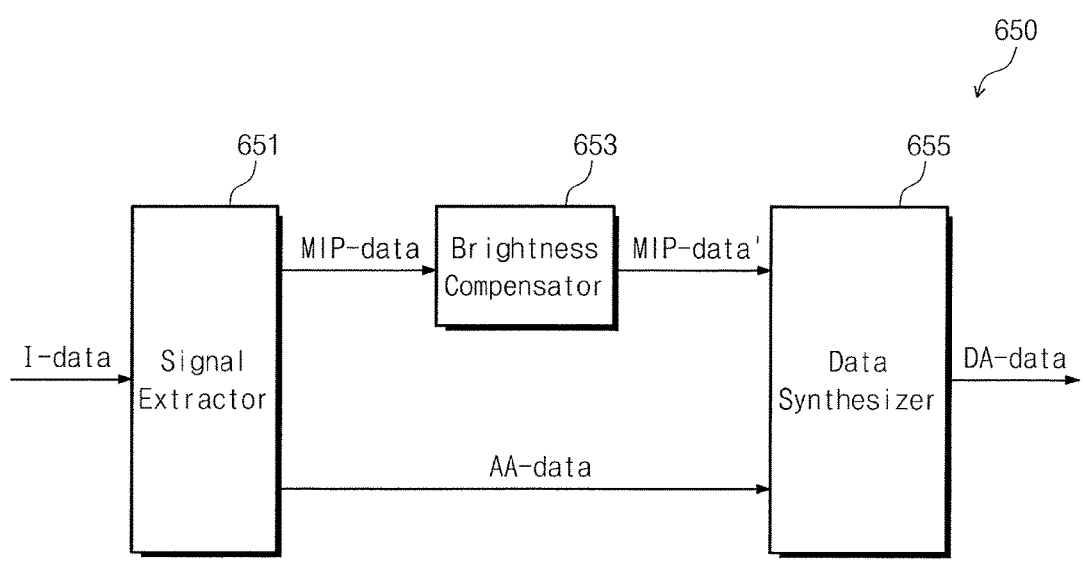
FIG. 12 illustrates an embodiment of a signal controller.

FIG. 12 illustrates an embodiment of a signal controller 650, which, for example, may be in display devices 700, 702, 704, and 706 to compensate brightness.

The signal controller 650 includes a signal extractor 651, a brightness compensator 653, and a data synthesizer 655. The signal extractor 651 receives input image data I-data from an external source and extracts first image data MIP-data (corresponding to the first and second pixel line areas MIP1 and MIP2) from the input image data I-data and applies second image data AA (corresponding to remaining data of the input image data I-data) to the data synthesizer 655. In the present exemplary embodiment, the second image data AA-data may be image data corresponding to the active area AA.

The first image data MIP-data, extracted from the input image data I-data by the signal extractor 651, are applied to the brightness compensator 653. The brightness compensator 653 compensates for the first image data MIP-data based on brightness compensation data. Compensation image data MIP-data' is then output. The brightness compensation data may, for example, be previously stored in a look-up table.

The data synthesizer 655 receives the compensation image data MIP-data' and the second image data AA-data and synthesizes the compensation image data MIP-data' and the second image data AA-data to generate entire image data DA-data corresponding to the entire of the display area DA. The data driving chip 450 generates the data signals to be displayed in the display area DA based on the entire image data DA-data. The data signals are applied to the display panel 350 (e.g., refer to FIG. 1).

The above-mentioned brightness compensation method compensates for the data signals applied to the pixels, even though an aperture ratio of the pixels in the first and second pixel line areas MIP1 and MIP2 is reduced by the first signal line MB1. Accordingly, the brightness of the first and second pixel line areas MIP1 and MIP2 may be prevented from being lower than the brightness of the active area AA, and thus the entire display quality of the display device may be improved.

The display devices 700, 702, 704, and 706 according to the present disclosure may further include a backlight assembly at a rear side of the display panel 350 that provides light to the display panel 350. An embodiment of the brightness compensation method may be performed using the backlight assembly.

Figure 13:
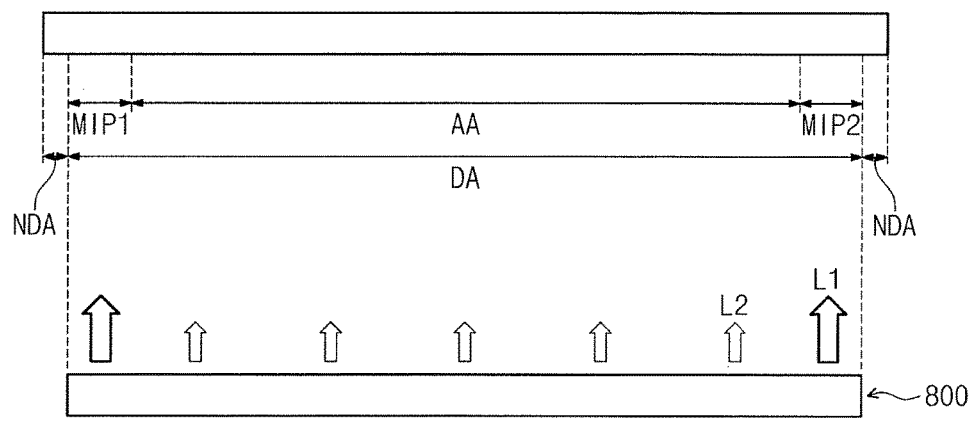
FIG. 13 illustrates an embodiment of a backlight assembly.

FIG. 13 is a cross-sectional view illustrating an embodiment of a backlight assembly 800. Referring to FIG. 13, the backlight assembly 800 is at the rear side of the display panel 350 to provide the light to the display panel 350.

The backlight assembly 800 provides, for example, first light L1 to the first and second pixel line area MIP1 and MIP2 and provides second light L2 with an intensity different from the first light L1 to the active area AA. When the first and second pixel line areas MIP1 and MIP2 have the aperture ratio less than that of the active area AA, the intensity of the first light L1 may be greater than the intensity of the second light L2. Accordingly, the brightness difference caused by the aperture ratio may be compensated by controlling the amount of light from the backlight assembly 800.

Figure 14:
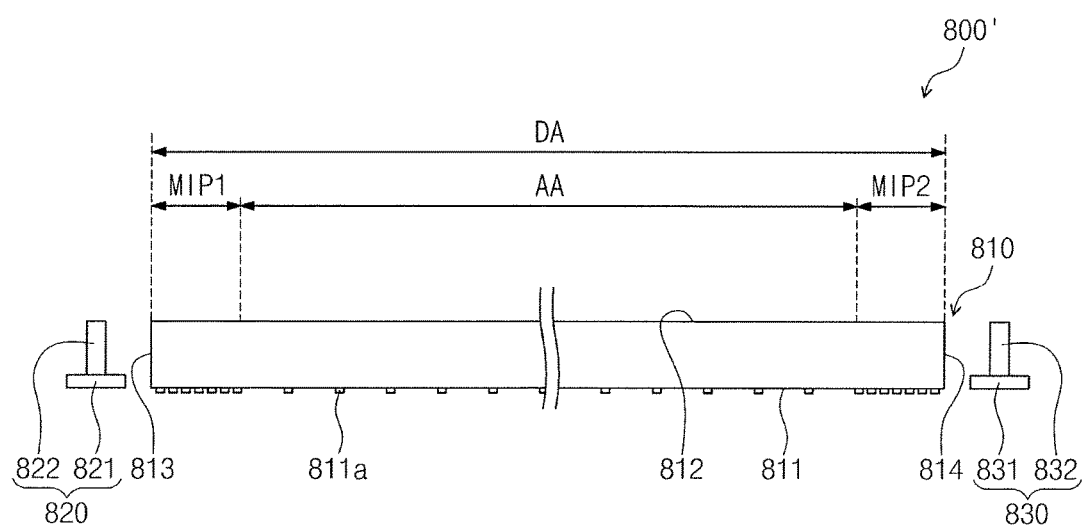
FIG. 14 illustrates an embodiment of a backlight assembly.

FIG. 14 illustrates another embodiment of a backlight assembly 800' which includes a light guide plate 810, a first light source unit 820 adjacent to one side surface of the light guide plate 810, and a second light source unit 830 adjacent to the other side surface of the light guide plate 810. The backlight assembly 800 may have an edge illumination structure, for example, in which light is provided to the side surfaces of the light guide plate 810.

The light guide plate 810 includes a bottom surface 811, an exit surface 812 facing the bottom surface 811, and side surfaces connecting the bottom surface 811 and the exit surface 812. The first light source unit 820 is adjacent to a first side surface 813 and the second light source unit 830 is adjacent to a second side surface 814. The first and second side surfaces 813 and 814 face each other.

The first light source unit 820 includes a first circuit film 821 and a first light source 822 mounted on the first circuit film 821. The second light source unit 830 includes a second circuit film 831 and a second light source 832 mounted on the second circuit film 831.

The light generated by the first light source 822 is incident to the light guide plate 810 through the first side surface 813. The light generated by the second light source 832 is incident to the light guide plate 810 through the second side surface 814.

The light guide plate 810 further includes a brightness control pattern 811a. The brightness control pattern 811a reflects or diffuses light incident to the light guide plate 810 to provide the reflected or diffused light to the exit surface 812. The brightness control pattern 811a may be a pattern printed on the bottom surface 811 or a recess or protrusion formed by processing the bottom surface 811.

In the present exemplary embodiment, the brightness control pattern 811a may be more densely formed in the first and second pixel line areas MIP1 and MIP2 than that of the active area AA. Thus, the density of the brightness control pattern 811a is greater than the density of the brightness control pattern 811a in the active area AA.

When the density of the brightness control pattern 811a in a corresponding area, the brightness of the light exiting from the exit surface 812 of the corresponding area increases. Accordingly, when the aperture ratio of the first and second line areas MIP1 and MIP2 is less than that of the active area AA, the brightness difference caused by the aperture ratio may be compensated by controlling the density of the brightness control pattern 811a.

In FIG. 14, the brightness control pattern 811a formed in the active area AA has a constant density. In one embodiment, the density of the brightness control pattern 811a may be controlled based on distances from the first and second light source units 820 and 830 in the active area AA.

Various brightness compensation methods using the backlight assembly 800 may therefore be applied to the display devices 700, 702, 704, and 706.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The signal controllers, compensators, synthesizers, extractors, and other processing features of the embodiments disclosed herein may be implemented in logic which, for example, may include hardware, software, or both. When implemented at least partially in hardware, the signal controllers, compensators, synthesizers, extractors, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the signal controllers, compensators, synthesizers, extractors, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display panel including a display area including a top display surface, and a non-display area outside the display area;

a printed circuit board electrically connected to the display panel and providing control signals;
at least one first flexible film having a first end attached to a first side surface of the display panel and another end attached to the printed circuit board; and
at least one second flexible film attached to a second side surface of the display panel, wherein:
the first side surface and the second side surface are orthogonal to the top display surface, and
the display panel includes:
a signal line, in the display area, connecting the at least one first flexible film and the at least one second flexible film and transmitting at least one of the control signals to the second flexible film;
a pad electrode extending from the signal line; and
a side surface connection electrode on the first and second side surfaces and directly contacting the pad electrode, the at least one first flexible film and the at least one second flexible film being coupled to the side surface connection electrode and electrically connected to the signal line.

2. The display device as claimed in claim 1, wherein:
the display panel includes a data line and a gate line in the display area,
the signal line includes a first signal line extending in a first direction along the data line in the display area and a second signal line extending in a second direction along the gate line in the display area, and
the first signal line is electrically connected to the second signal line.

3. The display device as claimed in claim 2, wherein:
the pad electrode includes a first pad electrode extending from the first signal line and a second pad electrode extending from the second signal line, and
the side surface connection electrode includes:
a first side surface connection electrode on the first side surface and directly contacting the first pad electrode; and
a second side surface connection electrode on the second side surface and directly contacting the second pad electrode.

4. The display device as claimed in claim 2, wherein:
the first signal line is divided into two or more sub-signal lines, and
the two or more sub-signal lines are in the display area.

5. The display device as claimed in claim 4, wherein the sub-signal lines have a different widths in the second direction.

6. The display device as claimed in claim 5, wherein the display area includes:
a pixel line area including the signal line,
an active area excluding the signal line, and
the widths of the sub-signal lines decrease with decreasing distance from the active area.

7. The display device as claimed in claim 2, wherein the display panel includes a dummy signal line in the non-display area and branched from the first signal line.

8. The display device as claimed in claim 2, further comprising:
a plurality of first flexible films; and
a plurality of second flexible films,
wherein the first signal line is divided into a plurality of sub-signal lines in the first direction, a first sub-signal line of the sub-signal lines connects the first flexible film and the second flexible film, and a second sub-signal line of the sub-signal lines electrically connects the second flexible films to each other.

9. The display device as claimed in claim 8, wherein the sub-signal lines are in the display area.

10. The display device as claimed in claim 8, wherein at least one of the second flexible films includes a connection line to electrically connect the first sub-signal line and the second sub-signal line.

11. The display device as claimed in claim 2, wherein:
the first flexible film is a data side flexible film electrically connected to the data line,
the second flexible film is a gate side flexible film electrically connected to the gate line,
the first signal line is to receive the at least one of the control signals from the first flexible film, and
the at least one of the control signals is to be applied to the second flexible film through the second signal line.

12. The display device as claimed in claim 11, further comprising:
a data driving chip, mounted on the first flexible film, to output a data signal applied to the data line; and
a gate driving chip, mounted on the second flexible film, to output a gate signal applied to the gate line based on the at least one of the control signals.

13. The display device as claimed in claim 12, wherein the at least one of the control signals includes a driving voltage and an off voltage to drive the gate driving chip.

14. The display device as claimed in claim 1, wherein the display area includes:
a pixel line area including the signal line;
an active area excluding the signal line; and
an aperture ratio of a pixel in the pixel line area is different from an aperture ratio of a pixel in the active area.

15. The display device as claimed in claim 14, further comprising:
a signal controller to compensate for a difference in brightness between the pixel line area and the active area, wherein the signal controller includes:
a signal extractor to receive input image data corresponding to the display area and to extract first image data corresponding to the pixel line area from the input image data and second image data corresponding to the active area from the input image data;
a brightness compensator to receive the first image data and compensate for a brightness of the first image data to output compensation image data; and
a data synthesizer to synthesize the compensation image data and the second image data in order to output entire image data corresponding to an entire of the display area.

16. The display device as claimed in claim 14, further comprising:
a backlight assembly at a rear side of the display panel to provide light to the display panel.

17. The display device as claimed in claim 16, wherein the backlight assembly includes:
a light guide plate including a bottom surface, an exit surface facing the bottom surface, and side surfaces connecting the bottom and exit surfaces; and
a light source, adjacent to one side surface of the side surfaces, to provide the light to the light guide plate.

18. The display device as claimed in claim 17, wherein:
the light guide plate includes a brightness control pattern on at least one of the bottom surface or the exit surface, and
the brightness control pattern is to compensate for a brightness difference between the pixel line area and the active area.

19. The display device as claimed in claim 18, wherein:
the brightness control pattern is on the bottom surface, and
a density of the brightness control pattern in an area corresponding to the pixel line area is greater than a density of the brightness control pattern in an area corresponding to the active area.

20. The display device as claimed in claim 16, wherein a first light to be provided to the pixel line area by the backlight assembly has an intensity greater than an intensity of a second light to be provided to the active area by the backlight assembly.

* * * * *